(12) United States Patent
Demircan et al.

(10) Patent No.: US 8,766,402 B2
(45) Date of Patent: Jul. 1, 2014

(54) INDUCTIVE ELEMENT WITH INTERRUPTER REGION

(75) Inventors: Ertugrul Demircan, Austin, TX (US); Thomas F. McNelly, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/489,139

(22) Filed: Jun. 5, 2012

(65) Prior Publication Data

US 2013/0320490 A1    Dec. 5, 2013

(51) Int. Cl.
*H01L 27/08*  (2006.01)
*H01L 21/02*  (2006.01)
*H01L 29/66*  (2006.01)

(52) U.S. Cl.
USPC ............................ 257/531; 257/277; 257/548

(58) Field of Classification Search
USPC .......................................................... 257/531
See application file for complete search history.

(56) References Cited

U.S. PATENT DOCUMENTS

| 6,426,543 | B1 | 7/2002 | Maeda |  |
|---|---|---|---|---|
| 7,135,951 | B1 * | 11/2006 | Sidhu et al. | 336/200 |
| 2009/0146252 | A1 * | 6/2009 | Huang et al. | 257/531 |

OTHER PUBLICATIONS

Chang, J. et al., "Effects of Dummy patterns and Substrate on Spiral Inductors for Sub-micron RF ICs", IEEE Radio Frequency Integrated Circuits Symposium, 2002, pp. 419-422.
Gaskill, S. et al., "Isolation Enhancement in Integrated Circuits Using Dummy Metal Fill", IEEE Radio Frequency Integrated Circuits Symposium, 2008, pp. 483-486.
Holik, S. et al., "Simplified Model of Interconnect Layers under a Spiral Inductor", Journal of Microwaves, Optoelectronics and Electromagnetic Applications, vol. 10, No. 2, Dec. 2011, pp. 337-342.
Nan, L. et al., "Experimental Characterization of the Effect of Metal Dummy Fills on Spiral Inductors", IEEE Radio Frequency Integrated Circuits Symposium, 2007, pp. 307-310.
Tiemeijer, L. et al., "Physics-Based Wideband Predictive Compact Model for Inductors With High Amounts of Dummy Metal Fill", IEEE Transactions on Microwave Theory and Techniques, vol. 54, No. 8, Aug. 2006, pp. 3378-3386.

* cited by examiner

*Primary Examiner* — Alexander Sofocleous
*Assistant Examiner* — Jay C Chang
(74) *Attorney, Agent, or Firm* — Joanna G. Chiu; James L. Clingan, Jr.

(57) ABSTRACT

A semiconductor device structure a semiconductor substrate having a first conductivity type and a top surface. A plurality of first doped regions is at a first depth below the top surface arranged in a checkerboard fashion. The first doped regions are of a second conductivity type. A dielectric layer is over the top surface. An inductive element is over the dielectric layer, wherein the inductive element is over the first doped regions.

11 Claims, 4 Drawing Sheets

INDUCTIVE ELEMENT WITH INTERRUPTER REGION

BACKGROUND

1. Field

This disclosure relates generally to semiconductor processing, and more specifically, to an interrupter region for an inductive element.

2. Related Art

Inductive elements formed over semiconductor substrates result in the formation of eddy currents within the substrate. An inductive element may include an inductor, or any other type of circuit which includes an inductor coil, such as, for example, a transformer, balun, antenna, motor, etc. The quality (Q) factor of an inductive element is inversely proportional to these eddy currents squared. Therefore, by reducing eddy currents, the performance of an inductive element may be improved.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

As described above, inductive elements typically result in eddy currents in the substrate, and the Q factor of an inductor element is inversely proportional to these eddy currents squared. Therefore, in one embodiment, eddy currents are reduced by increasing substrate resistance in order to achieve enhanced inductive performance. In one embodiment, within a region of the substrate defined by the coil of an inductive element, one or more interrupter layers are formed which interrupts the eddy currents. Each interrupter layer may include numerous oppositely doped regions arranged in an alternating pattern which create diodes to block the eddy currents. In this manner, eddy currents are confined to these doped regions of each interrupter layer rather than being allowed for form larger current loops within the perimeter of the coil. Note that eddy current losses are proportional to the inductively induced voltage (V) squared over resistance (R), which may be represented as "$V^2/R$". The voltage (V) varies directly as area (A) according to Faraday's Law; therefore, the Eddy current losses also vary directly as $A^2/R$. Therefore, by confining the eddy currents to the smaller doped regions within the region of the substrate defined by the coil of the inductive element, the resultant eddy current losses can be reduced, thus allowing for an increased Q factor. This will further be described in reference to FIGS. 1-8 below. Also, note that in any embodiment, P type and N type regions can be reversed.

Figure 2:
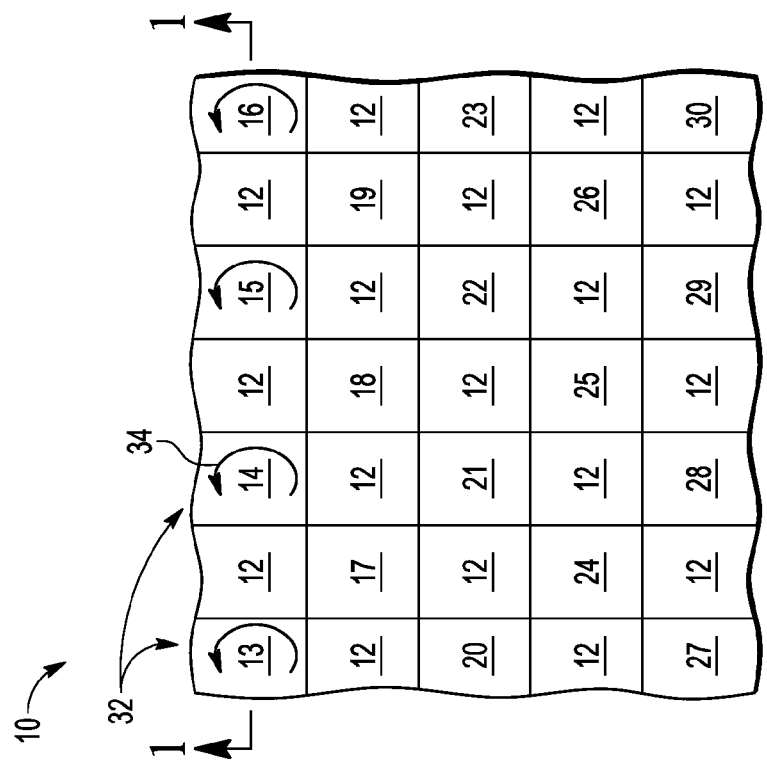
FIG. 2 illustrates a top-down view of the semiconductor device structure of FIG. 1.
Figure 1:
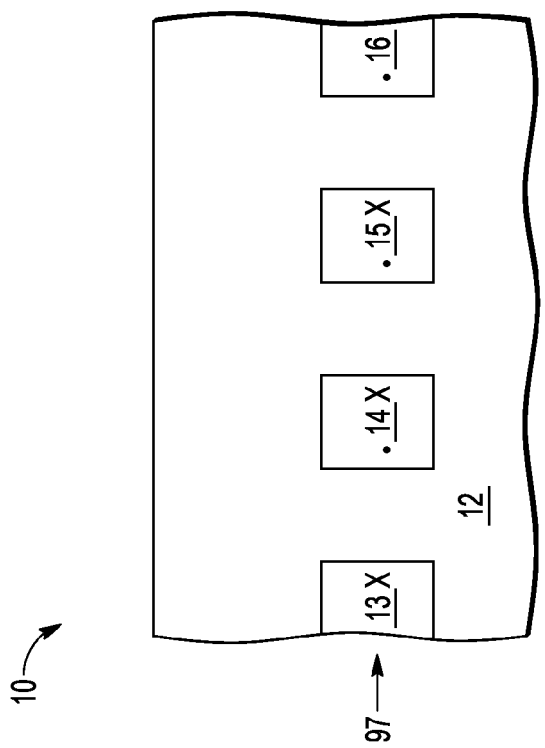
FIG. 1 illustrates a cross-sectional view of a semiconductor device structure at a stage in processing, in accordance with an embodiment of the present disclosure.

FIG. 1 illustrates a cross-sectional view of a semiconductor device structure 10 in accordance with an embodiment. Semiconductor device 10 includes a semiconductor substrate 12 and an interrupter region 97 (also referred to as an interrupter layer). Interrupter region 97 includes a plurality of doped regions 13-16 located at a first depth below the top surface of substrate 12. FIG. 2 illustrates a corresponding top down view of interrupter region 97 of structure 10. As illustrated in FIG. 2, interrupter region 97 includes doped regions 13-30, which may be referred to collectively as doped regions 32. Doped regions 32 are arranged in a point touch fashion such that they form an alternating pattern with substrate 12. In one embodiment, as illustrated in FIG. 2, doped region 32 are arranged in a checkerboard fashion. Doped regions 30 also define a plurality of substrate regions at this depth (indicated as 12 in FIG. 2), in which these substrate regions are in a checkerboard pattern complementary to the checkerboard pattern of doped regions 32. In one embodiment, substrate 12 is in its natural state, having, for example, a natural doping of P-. Alternatively, substrate 12 may be doped, prior to the formation of doped region 13-30 in order to increase the resistance of substrate 12. For example, substrate 12 may be counterdoped to have an even lower P type conductivity, such as, for example, P---. In this embodiment, the counterdoping is performed prior to formation of doped regions 30, and doped regions 30 are formed in the portion of substrate 12 which has been counterdoped. Doped regions 30 may be referred to as deep N type implants in which a patterned masking layer is formed over substrate 12, and an N type implant is performed into substrate 12 using the patterned masking layer. (Note that this implant process may be referred to as a patterned implant.) In one embodiment, doped regions 32 have a doping of N-, or alternatively, a doping of N---.

Within interrupter layer 97, eddy currents from an overlying inductive element (not illustrated in FIG. 1), are restricted to be within each of the doped regions. The diodes (e.g. PN junctions) formed between a doped region and a neighboring substrate region prevents the eddy currents from leaving that doped region. Therefore, with exemplary doped regions 13-16 of doped regions 30, an eddy current, such as exemplary eddy current 34, is substantially confined to that corresponding doped region. The eddy currents are typically located in a horizontal plane parallel to the opening of the inductor coil. Therefore, as illustrated in FIG. 1, in each of doped regions 13-16, the current enters the page at the "x" and exits the page at the "●". Therefore, note that doping of substrate 12 at the depth of doped regions 32 may be doped to a level which maximizes resistance of substrate 12 while still maintaining (i.e. sustaining) the PN junctions.

Figure 4:
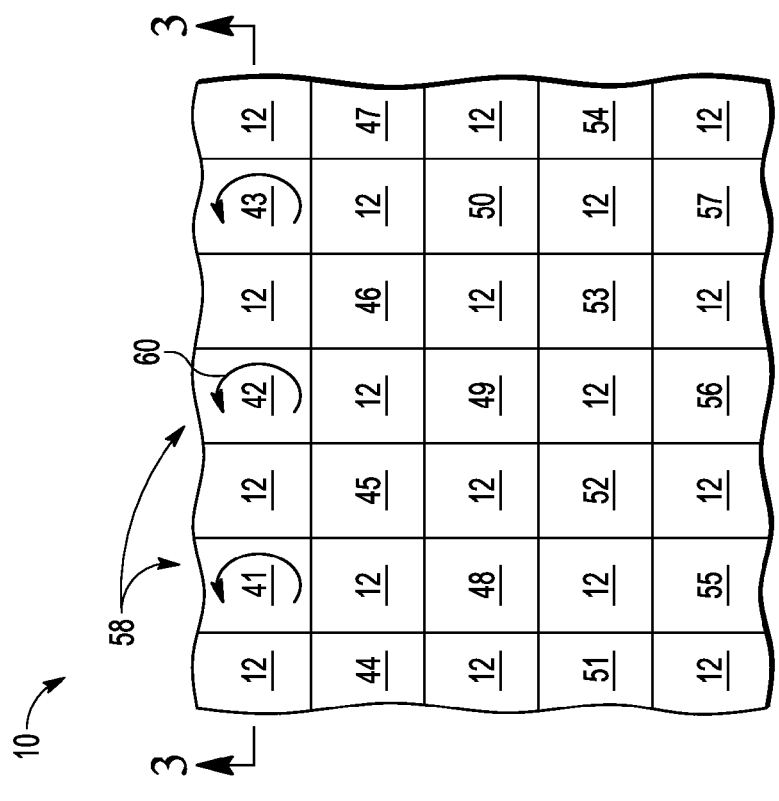
FIG. 4 illustrates a top-down view of the semiconductor device structure of FIG. 3.
Figure 3:
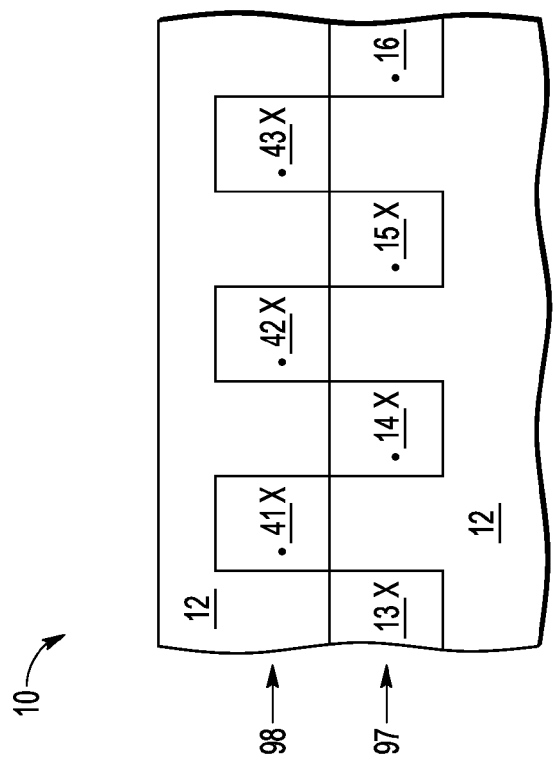
FIG. 3 illustrates a cross-sectional view of the semiconductor device structure of FIG. 1 at a subsequent stage in processing, in accordance with an embodiment of the present disclosure.

FIG. 3 illustrates a cross-sectional view of a semiconductor device structure 10 in accordance with an embodiment. Semiconductor device 10 includes an interrupter region 98 (also referred to as an interrupter layer) formed within substrate 12 directly over interrupter region 97. Interrupter region 98 includes a plurality of doped regions 41-43. FIG. 4 illustrates a corresponding top down view of interrupter region 98 of structure 10. As illustrated in FIG. 4, interrupter region 98 includes doped regions 41-57 (collectively referred to as doped regions 58) at a second depth in substrate 12, above interrupter region 97. Doped regions 58 are arranged in a point touch fashion such that they form an alternating pattern with substrate 12. In one embodiment, as illustrated in FIG. 4, doped regions 58 are arranged in a checkerboard fashion. Doped regions 58 also define a plurality of substrate regions at this second depth (indicated as 12 in FIG. 4), in which these substrate regions are in a checkerboard pattern complementary to the checkerboard pattern of doped regions 58. Doped regions 58 are formed directly on (and are thus aligned to) the substrate regions of interrupter region 97 located between doped regions 13-30. That is, substrate regions of interrupter region 98 are directly on doped regions 13-30. Doped regions 58 may be referred to as N type implants in which a patterned masking layer is formed over substrate 12, and an N type implant is performed into substrate 12 using the patterned masking layer. (Note that this implant process may be referred to as a patterned implant.) In one embodiment, doped regions 58 have a doping of N-, or alternatively, a doing of N---. Doped regions 58 may have a same doping as doped regions 32. If substrate 12 is counterdoped, doped regions 58 are also formed in this portion of substrate 12.

Within interrupter layer 98, eddy currents from an overlying inductive element, are restricted to be within each of the doped regions. The diodes (e.g. PN junctions) formed between a doped region and a neighboring substrate region (both within the same interrupter region and with underlying or overlying interrupter regions) prevents the eddy currents from leaving the doped regions. Therefore, with exemplary doped regions 41-43 of doped regions 58, an eddy current, such as exemplary eddy current 60, is substantially confined to the corresponding doped region. Therefore, as with interrupter region 97, the doping of substrate 12 at the depth of doped regions 58 may be doped to a level which maximizes resistance of substrate 12 while still maintaining the PN junctions. Therefore, note that the portion of substrate 12 in which doped regions 32 and 58 are formed has a first conductivity type, and doped regions 32 and 58 have a second conductivity type, opposite from the first conductivity type.

While doped regions 32 and doped regions 58 are preferably formed in a point touch fashion such that the corners touch at a point, the corners may not fully touch in all locations. In these cases, the eddy currents at these corners would be relatively small due to the high resistance at the corner between the substrate regions (because the spacing between these corners that do not fully touch would be small).

Note that while two interrupter regions 97 and 98 are illustrated, substrate 12 may include any number of interrupter regions which include similar alternating patterns of doped regions to further constrain the eddy currents. However, note that the deeper the distance into substrate 12 (from the top surface of substrate 12), the less effect the eddy currents have on inductive performance. In one embodiment, substrate 12 in interrupter region 98 will also have similar eddy currents as in dielectric regions 41-43, but substrate 12 in interrupter region 97 may have a more three dimensional current profile merging into the bulk substrate below.

Figure 6:
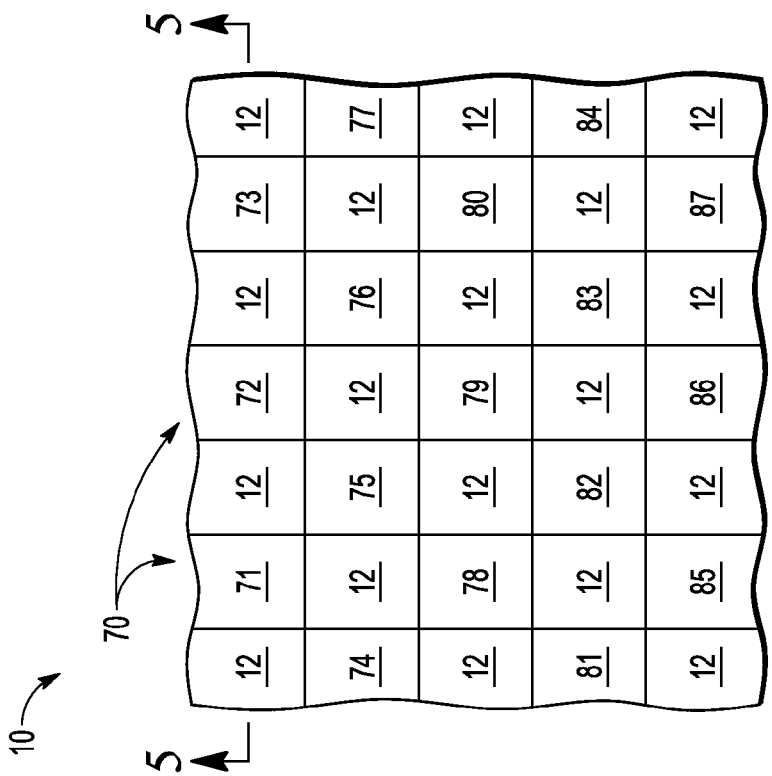
FIG. 6 illustrates a top-down view of the semiconductor device structure of FIG. 5.
Figure 5:
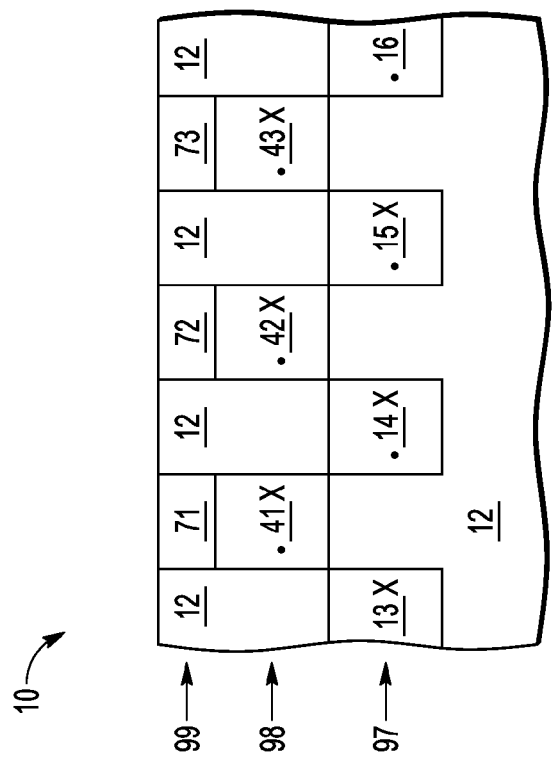
FIG. 5 illustrates a cross-sectional view of the semiconductor device structure of FIG. 3 at a subsequent stage in processing, in accordance with an embodiment of the present disclosure.

FIG. 5 illustrates a cross-sectional view of a semiconductor device structure 10 in accordance with an embodiment. Semiconductor device 10 includes an interrupter region 99 (also referred to as an interrupter layer) formed within substrate 12 directly over interrupter region 98. Interrupter region 99 includes a plurality of dielectric regions 41-43. FIG. 6 illustrates a corresponding top down view of interrupter region 99 of structure 10. As illustrated in FIG. 6, interrupter region 99 includes dielectric regions 71-87, which may be referred to collectively as dielectric regions 70. In one embodiment, dielectric regions 70 are oxide regions. Dielectric regions 70 may be formed by forming a patterned masking layer over substrate 12, which includes openings to define the location of corresponding openings at a surface of substrate 12. An etch is then performed to form the openings in substrate 12 in accordance with the patterned masking layer. Afterwards, the patterned masking layer is removed, and a dielectric material, such as an oxide, may be formed over substrate 12 and within the openings. A chemical mechanical polish (CMP) is then performed to planarize the surface of substrate 12 and thus result in dielectric regions 70.

Dielectric regions 70 may be formed in any variety of patterns. In one embodiment, as illustrated in FIGS. 5 and 6, they are arranged in a point touch fashion such they form an alternating pattern within substrate 12. In one embodiment, as illustrated in FIG. 4, dielectric regions 70 are arranged in a checkerboard fashion and extend from the top surface of substrate 12 to a third depth, such that dielectric regions 70 are formed over doped regions 58 (i.e. over interrupter region 98). Dielectric regions 70 also define a plurality of substrate regions (indicated as 12 in FIG. 6), in which these substrate regions are in a checkerboard pattern complementary to the checkerboard pattern of dielectric regions 70. In the illustrated embodiment, each dielectric region is formed directly on a doped region of interrupter region 98 such that dielectric regions 70 are aligned to doped regions 58. However, in an alternate embodiment, each dielectric region may be formed directly on a substrate region of interrupter region 98 such that dielectric regions 70 are aligned to the substrate regions of interrupter region 98. In this embodiment, a substrate region of interrupter region 99 would be directly on the doped regions of interrupter region 98. In yet another alternate embodiment, interrupter region 99 may include a layer of dielectric having a plurality of substrate islands. In this example, the patterned masking layer would include portions to protect the desired locations of these islands during the substrate etch.

Figure 8:
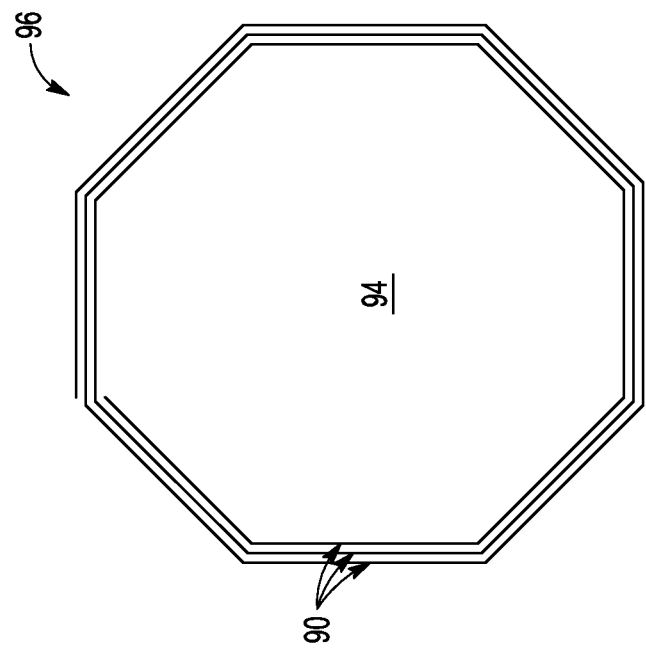
FIG. 8 illustrates a top-down view of an inductive element, in accordance with an embodiment of the present disclosure.
Figure 7:
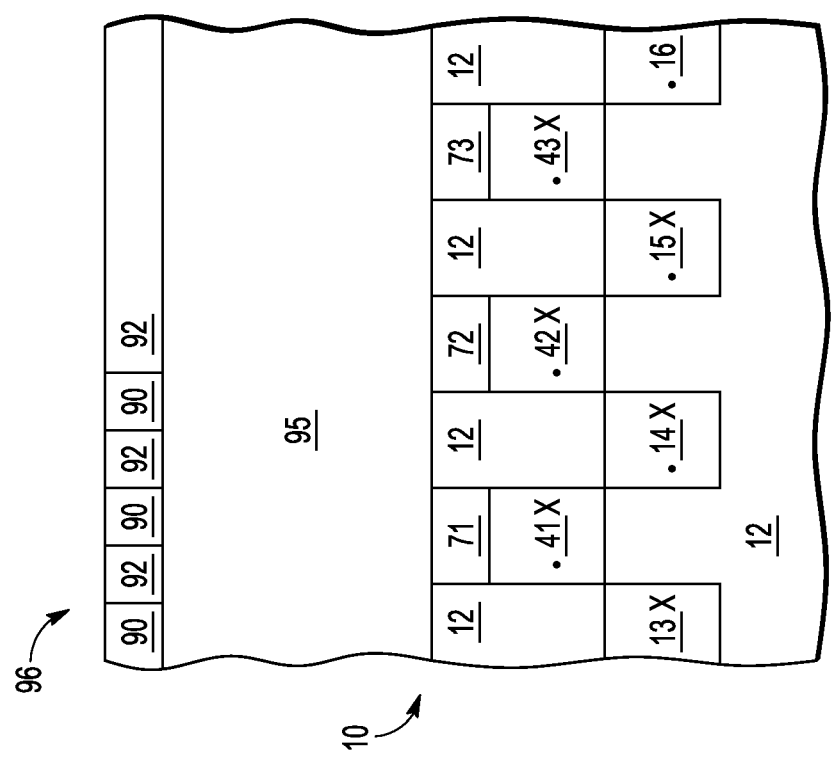
FIG. 7 illustrates a cross-sectional view of the semiconductor device structure of FIG. 5 at a subsequent stage in processing, in accordance with an embodiment of the present disclosure.

FIG. 7 illustrates a cross-sectional view of a semiconductor device structure 10 in accordance with an embodiment at a subsequent stage in processing. Structure 10 includes one or dielectric layers 95 formed over substrate 12. An inductive element 96 is formed over dielectric layer 95 and over interrupter regions 97-99. In alternate embodiments, wiring or other semiconductor devices may be embedded within dielectric layer 95. Note that FIG. 7 only illustrates a portion of inductive element 96. Inductive element 96 includes inductive lines 92 which represent the coil of the inductive element. The inductive lines 92 are formed within a dielectric material 92. FIG. 8 illustrates a top down view of inductive element 96. Inductive element 96, as illustrated, includes 3 coils, thus corresponding to the 3 inductive lines 92 illustrated in FIG. 7. The coil of inductive element 96 defines a perimeter of a region 94 of inductive element 96 within the coil. In one embodiment, interrupter regions 97-99 are formed at least within substrate 12 which is directly below region 94. That is, the eddy currents are most prominent in substrate 12 within the region directly below region 94 within the coil of inductive element 96. In alternate embodiments, the interrupter regions may be formed within a portion of region 94 or may extend beyond the coils of inductive element 96.

In one embodiment, a width of the inductor coil of inductive element 96, is at least 30 microns. Alternatively, the width is at least 600 microns. In one embodiment, a width of each of doped regions 58 and 32 is at most 2 microns. That is, doped region corresponds to a fraction of the surface area of region 94. Therefore, without interrupter regions 97-99, eddy currents would be allowed to form large loops within substrate 12 under region 94. However, with interrupter regions 97-99, resistance of substrate 12 is increased, thus reducing the eddy currents. That is, the loops of eddy currents are restricted to be within each of the doped regions 32 and 58. In this manner, with the area for each eddy current reduced, the total eddy current is reduced.

If it is assumed that, when viewed from top down, each doped region has a square shape with a width of S, and it is assumed that the area, A, of region 94 approximates $X^2$ (in which X corresponds to the width of inductive element 96), then the area of each doped regions is $S^2$ and the number of doped regions, N, within substrate 12 directly under region 94 is $(X/S)^2$ (since A or $X^2$ can be expressed as approximately $N \cdot S^2$). Since the Eddy current losses vary directly as $A^2/R$ (as was described above), then the Eddy current losses vary directly as $(N \cdot S^2)^2/R$, which can be expressed as $(X/S)^2 \cdot S^4/R$). Note also that resistance, R, is proportional to perimeter, and thus, is proportional to S. Therefore, the Eddy current losses vary directly as $(X/S)^2 \cdot S^4/S$), which can be simplified to $X^2 S$. In this manner, the eddy currents, with the presence of doped regions 32 and 58, the Eddy current losses varies directly as $X^2 S$, with S being much smaller than X (by at least a factor of 10 or at least by a factor of 100). Without the presence of doped regions 32 and 38, the Eddy current losses vary directly as $X^3$, which is much greater.

Note that the while the shape of doped regions 32 and 58, as viewed from the top-down as in FIGS. 2 and 4 are square in shape (thus having an aspect ratio of 1) and have substantially the same area, they may have different shapes (e.g. shapes having an aspect ratio different than one) and/or different areas in alternate embodiments. For example, they may be rectangular in shape, or may have other circular or irregular shapes. Also, note that the shapes and area of doped regions 32 may be different from those of doped regions 58.

The semiconductor substrate described herein can be any semiconductor material or combinations of materials, such as gallium arsenide, silicon germanium, silicon-on-insulator (SOI), silicon, polycrystalline silicon, the like, and combinations of the above.

By now it should be appreciated that there has been provided a semiconductor device structure which includes an inductive element and one or more interrupter regions formed in the substrate directly under the inner region of the inductive element coil. These interrupter regions include doped regions which increase substrate resistance and confine eddy currents to much smaller areas. In this manner, the Q factor of the inductive element may be improved.

Although the invention has been described with respect to specific conductivity types or polarity of potentials, skilled artisans appreciated that conductivity types and polarities of potentials may be reversed.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, different doping levels may be used for the substrate and doped regions, and a different number of interrupter regions may be used. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a semiconductor device structure including a semiconductor substrate having a first conductivity type and a top surface; a plurality of first doped regions at a first depth below the top surface arranged in a checkerboard fashion, wherein the first doped regions are of a second conductivity type; a dielectric layer over the top surface; and an inductive element over the dielectric layer, wherein the inductive element is over the first doped regions. Item 2 includes the semiconductor device structure of item 1, wherein the substrate has a natural doping of P- and where the first doped regions are located has a doping of P---. Item 3 includes the semiconductor device structure of item 2, wherein the first doped regions have a doping of N-. Item 4 includes the semiconductor device structure of item 1, and further includes a plurality of second doped regions arranged in a checkerboard fashion, wherein the second doped regions are of the second conductivity type and are above and aligned to the first regions in the substrate. Item 5 includes the semiconductor device structure of item 4, wherein the second doped regions define a plurality of second regions in the substrate above the first regions in the substrate and above the first doped regions, whereby the second regions in the substrate are in a checkerboard pattern complementary to the checkerboard pattern of the first doped regions. Item 6 includes the semiconductor device structure of item 5, wherein the substrate has a natural doping of P-, the first doped region and the second doped region having a doping level of N--- and the first region and the second region in the substrate have a doping level of P---. Item 7 includes the semiconductor device structure of item 5, wherein each of the first doped regions and each of the second doped regions of the substrate are substantially square and of a same area. Item 8 includes the semiconductor device structure of item 5, and further includes a plurality of dielectric regions formed in the substrate from the top surface to a second depth, wherein the dielectric regions are in a checkerboard pattern over the second doped region and the second region in the substrate and the dielectric regions are aligned to the second doped regions. Item 9 includes the semiconductor device structure of item 8, wherein the plurality of dielectric regions define a plurality of third regions in the substrate above the second regions in the substrate and the above the second doped regions, wherein the third regions in the substrate are in a checkerboard pattern complementary to the checkerboard pattern of the third doped regions. Item 10 includes the semiconductor device structure of item 9, wherein the first, second, and third regions in the substrate are doped to a level to maximize resistance while maintaining a PN junction with the first, second, and third doped regions, respectively. Item 11 includes the semiconductor device structure of item 10, wherein each of the first doped regions and each of the first regions in the substrate are rectangular and have an aspect ratio different than one.

Item 12 includes a method of forming a semiconductor device structure using a semiconductor substrate, the method including performing a patterned implant to form a plurality of first doped regions at a first depth below the top surface arranged in a checkerboard fashion, wherein the first doped regions are of a second conductivity type; forming a dielectric layer over the top surface; and forming an inductive element over the dielectric layer, wherein the inductive element is over the first doped regions. Item 13 includes the method of item 12, and further includes counterdoping the substrate to increase a resistance of a portion of the substrate. Item 14 includes the method of item 13, wherein the counterdoping changes the portion of the substrate from P- to P---, wherein the performing the patterned implant is applied to the portion of the substrate, and wherein the portion includes where the first doped regions are formed. Item 15 includes the method of item 12, wherein the performing the patterned implant is further characterized by the first doped regions defining a plurality of first regions in the substrate at the first depth of a checkerboard pattern complementary to the checkerboard pattern of first doped regions. Item 16 includes the method of item 13, and further includes performing a patterned implant above the first doped regions to form second doped regions, wherein the second doped regions are above and aligned to the first regions in the substrate and the second doped regions define second regions in the substrate. Item 17 includes the method of item 16, and further includes forming dielectric regions in the substrate over and aligned to the second doped regions. Item 18 includes the method of item 16, and further includes forming dielectric regions in the substrate over and aligned to the second regions in the substrate.

Item 19 includes a semiconductor device structure including a semiconductor substrate having a first conductivity type and a top surface, wherein the semiconductor substrate has a first portion doped to a level in which resistance is maximized while still be able to sustain a PN junction; a plurality of first doped regions in the first portion at a first depth below the top surface arranged in a checkerboard fashion, wherein the first doped regions are of a second conductivity type; a dielectric layer over the top surface; and an inductive element over the dielectric layer, wherein the inductive element is over the first doped regions. Item 20 includes the semiconductor device structure of item 19, and further includes a plurality of second doped regions arranged in a checkerboard fashion, wherein the second doped regions are of the second conductivity type and are above and aligned to the first regions in the substrate and define a plurality of second regions in the substrate having a checkerboard pattern complementary to the checkerboard pattern of the second doped regions; and a plurality of dielectric regions formed in the substrate from the top surface to a second depth, wherein the dielectric regions are in a checkerboard pattern over the second doped region and the second region in the substrate.

What is claimed is:

1. A semiconductor device structure, comprising:
a semiconductor substrate having a first conductivity type and a top surface;
a plurality of first doped regions at a first depth below the top surface arranged in a checkerboard fashion, wherein the plurality of first doped regions are of a second conductivity type, and wherein the plurality of first doped regions define a plurality of first regions in the substrate at the first depth, whereby the plurality of first regions in the substrate are in a checkerboard pattern in which each first region of the plurality of first regions is between adjacent first doped regions of the plurality of first doped regions;
a plurality of second doped regions arranged in a checkerboard fashion, wherein the plurality of second doped regions are of the second conductivity type and are above and directly on the plurality of first regions in the substrate;
a dielectric layer over the top surface; and
an inductive element over the dielectric layer, wherein the inductive element is over the plurality of first doped regions.

2. The semiconductor device structure of claim 1, wherein the substrate has a natural doping of P- and where the plurality of first doped regions are located has a doping of P---, wherein the doping of P--- has a lesser p-type dopant concentration than P-.

3. The semiconductor device structure of claim 2, wherein the plurality of first doped regions have a doping of N-.

4. The semiconductor device structure of claim 1, wherein the plurality of second doped regions define a plurality of second regions in the substrate above the plurality of first regions in the substrate and above the plurality of first doped regions, whereby the plurality of second regions in the substrate are in a checkerboard pattern in which each second region of the plurality of second regions is between adjacent second doped regions of the plurality of second doped regions.

5. The semiconductor device structure of claim 4, wherein the substrate has a natural doping of P-, the plurality of first doped regions and the plurality of second doped regions having a doping level of N--- and the plurality of first regions and the plurality of second regions in the substrate have a doping level of P---, wherein the doping level of P--- has a lesser p-type dopant concentration than P- and the doping level of N--- has a lesser n-type dopant concentration than N-.

6. The semiconductor device structure of claim 4, wherein each of the plurality of first doped regions and each of the plurality of second doped regions of the substrate are substantially square and of a same area.

7. A semiconductor device structure, comprising:
a semiconductor substrate having a first conductivity type and a top surface;
a plurality of first doped regions at a first depth below the top surface arranged in a checkerboard fashion, wherein the plurality of first doped regions are of a second conductivity type, and wherein the plurality of first doped regions define a plurality of first regions in the substrate at the first depth, whereby the plurality of first regions in the substrate are in a checkerboard pattern in which each first region of the plurality of first regions is between adjacent first doped regions of the plurality of first doped regions;
a plurality of second doped regions arranged in a checkerboard fashion, wherein the plurality of second doped regions are of the second conductivity type and are above and directly on the plurality of first regions in the substrate;

a plurality of dielectric regions formed in the substrate from the top surface to a second depth, wherein the plurality of dielectric regions are in a checkerboard pattern over the plurality of second doped regions and the plurality of dielectric regions are aligned to the plurality of second doped regions;

a dielectric layer over the top surface; and an inductive element over the dielectric layer, wherein the inductive element is over the plurality of first doped regions.

8. The semiconductor device structure of claim 7, wherein the plurality of dielectric regions define a plurality of third regions in the substrate above the plurality of second regions in the substrate and above the plurality of second doped regions, wherein the plurality of third regions in the substrate are in a checkerboard pattern in which each third region of the plurality of third regions is between adjacent dielectric regions of the plurality of dielectric regions.

9. The semiconductor device structure of claim 8, wherein the plurality of first regions, plurality of second regions, and plurality of third regions in the substrate are doped to a level to maximize resistance while maintaining a PN junction with the plurality of first doped regions, plurality of second doped regions, and plurality of third doped regions, respectively.

10. A semiconductor device structure, comprising:

a semiconductor substrate having a first conductivity type and a top surface, wherein the semiconductor substrate has a first portion doped to a level in which resistance is maximized while still be able to sustain a PN junction;

a plurality of first doped regions in the first portion at a first depth below the top surface arranged in a checkerboard fashion, wherein the plurality of first doped regions are of a second conductivity type, and wherein the plurality of first doped regions define a plurality of first regions in the substrate at the first depth, whereby the plurality of first regions in the substrate are in a checkerboard pattern in which each first region of the plurality of first regions is between adjacent first doped regions of the plurality of doped regions;

a plurality of second doped regions arranged in a checkerboard fashion, wherein the plurality of second doped regions are of the second conductivity type and are above and directly on the plurality of first regions in the substrate and define a plurality of second regions in the substrate having a checkerboard pattern complementary to the checkerboard pattern of the plurality of second doped regions;

a plurality of dielectric regions formed in the substrate from the top surface to a second depth, wherein the plurality of dielectric regions are in a checkerboard pattern over the plurality of second doped regions and the second regions in the substrates;

a dielectric layer over the top surface; and an inductive element over the dielectric layer, wherein the inductive element is over the plurality of first doped regions.

11. The semiconductor device structure of claim 9, wherein each of the first doped regions and each of the first regions in the substrate are rectangular and have an aspect ratio different than one.

* * * * *